US007074342B2

(12) United States Patent
Tateno

(10) Patent No.: US 7,074,342 B2
(45) Date of Patent: Jul. 11, 2006

(54) METHOD OF MANUFACTURING OPTICAL CRYSTAL ELEMENT OF LASER

(75) Inventor: Ryo Tateno, Kyoto (JP)

(73) Assignee: Shimadzu Corporation, Kyoto (JP)

( * ) Notice: Subject to any disclaimer, the term of this patent is extended or adjusted under 35 U.S.C. 154(b) by 29 days.

(21) Appl. No.: 11/049,879

(22) Filed: Feb. 4, 2005

(65) Prior Publication Data

US 2005/0232320 A1    Oct. 20, 2005

(30) Foreign Application Priority Data

Feb. 6, 2004   (JP)   ............... 2004-030299

(51) Int. Cl.
*C23F 1/00*   (2006.01)
(52) U.S. Cl. ................ 216/24; 216/57; 216/60; 216/66; 216/75; 216/88
(58) Field of Classification Search ............. 216/24, 216/57, 60, 66, 75, 88
See application file for complete search history.

(56) References Cited

U.S. PATENT DOCUMENTS 6,942,812 B1 * 9/2005 Tateno et al. ............... 216/2

FOREIGN PATENT DOCUMENTS

| JP | 01-104760 | * | 4/1989 |
| JP | 06-224510 | * | 8/1994 |

OTHER PUBLICATIONS

"Improvement of surface laser damage resistance in CsLiB6010 cyrstal for high-power UV lasers"; Proceedings of SPIE (2000); vol. 3889; Kamiura et. al.; pp. 464-471.*
"A ytterbium- and neodymium-co-doped yttrium aluminum garnet-buried channel waveguide laser pumped at 0.81 um"; Applied Physics Letters (1995); 67 (5); pp. 582-584; Sugimoto et. al.*

* cited by examiner

*Primary Examiner*—George A. Goudreau
(74) *Attorney, Agent, or Firm*—Manabu Kanesaka

(57) ABSTRACT

A method of manufacturing an optical crystal element of a laser device includes measuring an initial thickness of a crystal substrate formed of YAG or $YVO_4$; introducing a mixture of a fluorine gas and an Ar gas having a ratio of the fluorine gas to the Ar gas in a range of 1:10 to 1:2 into a process chamber holding the crystal substrate; and generating ion beams of the mixture in the process chamber for etching a surface of the crystal substrate for a period time determined from an etching rate depending on the ratio of the mixture and the initial thickness of the crystal substrate. Thickness of the optical crystal element is controlled to a desired thickness. In the method, it is possible to produce the optical crystal element of a microchip laser having functions as a laser medium, a resonator and an etalon.

5 Claims, 4 Drawing Sheets

Fig. 3(a)  before etching
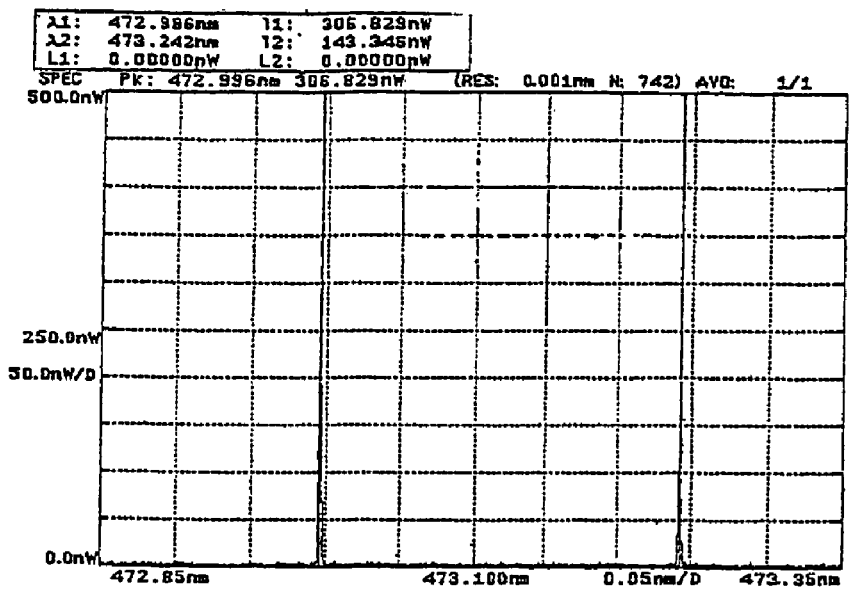
Fig. 3(b)  after etching
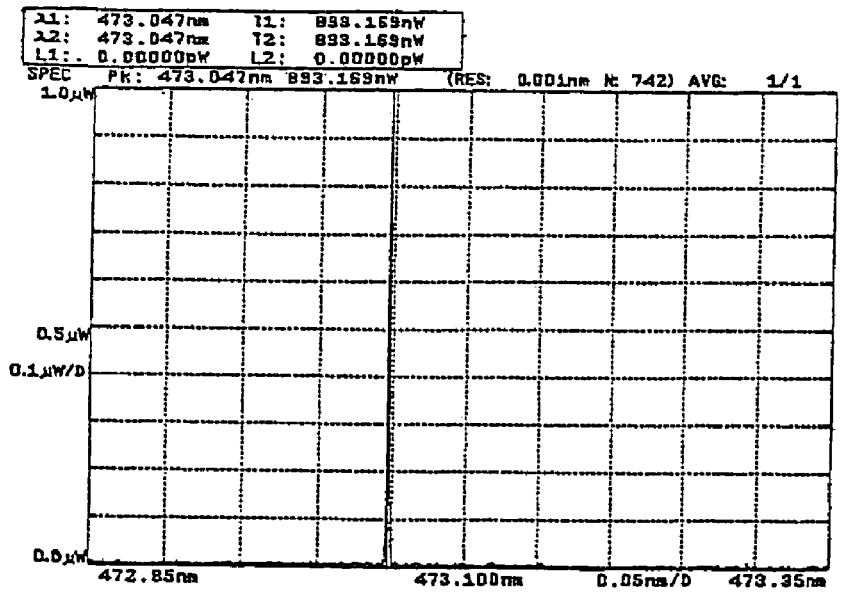

METHOD OF MANUFACTURING OPTICAL CRYSTAL ELEMENT OF LASER

BACKGROUND OF THE INVENTION AND RELATED ART STATEMENT

The present invention relates to a method of manufacturing an optical crystal element used in a semiconductor laser (LD) excitation solid-state laser device, and more specifically, relates to a method of manufacturing an optical crystal element having functions as a laser medium, resonator, and etalon, in a microchip laser.

In recent years, a short wavelength laser such as a green laser and blue laser has been focused in a broad range of fields including an interferometer, an optical disc pick-up, and a printer device. Accordingly, research and development for laser devices generating such laser light has been actively pursued. In a known short wavelength laser device, a wavelength conversion element is inserted in a path of fundamental wave laser light for generating high-order harmonic wave laser light to be emitted outwardly. FIG. 4 is a schematic view showing a structure of the laser device.

The laser device comprises a semiconductor laser (LD) 1 for generating excitation light; a lens 2 for focusing excitation light from the semiconductor laser 1; a laser medium 3 to be excited by excitation light for inducing and emitting laser light including fundamental wave light; a wavelength conversion element 4 formed of a non-linear optical crystal or the like for generating high-order harmonic light (especially second harmonic generation; SHG) from fundamental wave light from the laser medium 3; an etalon 5 for selectively transmitting light with a specific wavelength; and an output mirror 6 for reflecting light and transmitting a part of light.

Excitation light from the semiconductor laser 1 is conversed through the lens 2, and is irradiated on the laser medium 3. In the laser medium 3, a reflective layer 3a is formed on an incident plane of excitation light for efficiently transmitting excitation light and reflecting fundamental wave and high-order harmonic wave light at a high reflectance. The reflective layer 3a and the output mirror 6 comprise an optical resonator. The laser medium 3 induces and emits fundamental wave light through excitation light, and fundamental wave light oscillates and is amplified in the optical resonator. The laser medium 3 is primarily formed of, for example, Nd:YAG (hereinafter simply referred to as YAG) for oscillating blue light with a wavelength of 946 nm, or Nd:YVO4 (hereinafter simply referred to as YVO4) for oscillating green light with a wavelength of 1064 nm.

When fundamental wave light passes through the wavelength conversion element 4, high-order harmonic wave light is generated. Accordingly, fundamental wave light and high-order harmonic wave light coexist within the optical resonator. The output mirror 6 reflects fundamental wave light, while high-order harmonic wave light passes through the output mirror 6. Accordingly, as shown in the figure, only high-order harmonic wave laser light is irradiated to a right side of the output mirror 6 as a laser light output. During the oscillation process, high-order longitudinal oscillation modes (i.e., numerous oscillation wavelengths) are generated in laser light. The etalon 5 having a high transmittance is inserted into the optical resonator. Accordingly, among multiple oscillation spectra, it is possible to obtain only single longitudinal mode laser light with a desired wavelength and high coherent in a space region and a frequency (or wavelength) region.

In the laser device, it is necessary to accurately arrange the laser medium 3, the resonator (output mirror 6), the wavelength conversion element 4, and the etalon 5 at predetermined locations. Accordingly, it is difficult to reduce an overall size of the device. Further, it is necessary to provide an adjustment mechanism for adjusting a relative arrangement of the optical elements and a temperature controlling device for preventing temperature fluctuation due to an ambient temperature, thereby further increasing a size. Also, the device tends to have a complex configuration, thereby increasing cost.

In view of the problems, a laser device known as a microchip laser has been developed recently (see Non-Patent Reference 1). The microchip laser is provided with an extremely thin laser medium (usually about 1 mm or less in thickness), so that the laser medium has functions of a resonator and an etalon. FIG. 5 is a schematic view of a microchip laser device. The semiconductor laser 1 radiates excitation light, and excitation light is conversed through the lens 2 and irradiated on an optical crystal element 7 of the microchip laser. An entrance side reflective layer 7a and an exit side reflective layer 7b are formed on surfaces of the optical crystal element 7, respectively. When fundamental wave light is reflected between the two reflective layers 7a and 7b, an oscillation frequency is unified, so that laser light of a specific wavelength is emitted to the right side. With such a structure, it is not necessary to dispose the resonator and the etalon externally, thereby reducing a size of the laser device and eliminating cumbersome position adjustment.

As described above, the optical crystal element 7 of the microchip laser has a thickness smaller than that the laser medium 3 of the regular LD excitation solid-state laser device. It is necessary to control the thickness with high precision to obtain a desired property. Conventionally, an optical crystal formed of YAG or the like is formed to have a desired thickness with a mechanical polishing process to produce the laser medium. In the conventional method, it is difficult to achieve thickness accuracy for an optical crystal of a microchip laser. As another processing method, an ion light etching using argon (Ar) is generally known. However, an etching rate for an optical crystal formed of YAG or the like is extremely low, and the method is impractical in terms of productivity.

Patent Reference 1 has disclosed an etching method with efficient and good control in surface roughness. In the method, ion beam etching is conducted in a mixture of $CHF_3$ and Ar to control a thickness of an etalon formed of $SiO_2$. The optical crystal formed of YAG or the like has a physical property different from that of a glass formed of $SiO_2$. Accordingly, it is difficult to apply the method disclosed in Patent Reference 1 without adjusting an etching condition.

Patent Reference 1: Japanese Patent Publication (Kokai) No. 2003-304019

Non-Patent Reference 1: "Research and Development of Microchip Solid-state Laser", Shinji Motokoshi, [Online] Laser Cross, June 2001, No. 160, Institute of Laser Technology, searched on Jan. 21, 2004, Internet <http://www.il-t.or.jp/cross/no160.pdf>

In view of the problems described above, an object of the present invention is to provide a method of manufacturing an optical crystal element of a laser device, in which it is possible to control a thickness of the crystal element with high precision while maintaining high productivity.

Further objects and advantages of the invention will be apparent from the following description of the invention.

SUMMARY OF THE INVENTION

In order to attain the objects described above, according to the present invention, a method of manufacturing an optical crystal element for an LD excitation solid-state laser device includes the steps of measuring an initial thickness of a crystal substrate formed of YAG or $YVO_4$; introducing a mixture of a fluorine gas and an Ar gas having a ratio of the fluorine gas to the Ar gas in a range of 1:10 to 1:2 into a process chamber holding the crystal substrate; and generating ion beams of the mixture in the process chamber for etching a surface of the crystal substrate for a period time determined from an etching rate depending on the ratio of the mixture and the initial thickness of the crystal substrate. Accordingly, it is possible to control a thickness of the optical crystal element to be a desired thickness. In the method, it is possible to produce the optical crystal element of a microchip laser having functions as a laser medium, a resonator, and an etalon.

In the present invention, the fluorine gas typically includes tri-fluoromethane ($CHF_3$), and tetra-fluoromethane ($CF_4$) or the like may be used.

In the method of manufacturing an optical crystal element for a laser, the crystal substrate formed of YAG or YVO4 is prepared first with a conventional mechanical polishing technique. At this point, the crystal substrate has a various thickness (initial thickness), and the initial thickness is measured before etching. The etching time is calculated from a difference between the initial thickness and a target thickness, and the etching rate of the gas mixture is measured in advance.

The crystal substrate is placed in the chamber, and the gas mixture of the fluorine gas and the Ar gas chemically reactive to the crystal substrate at a ratio in a range of 1:10 to 1:2 is introduced into the chamber. The ion beams of the gas mixture are generated within the chamber surface, so that the ion beam etching is conducted to etch the surface of the crystal substrate for the period of time obtained from the calculation. In the ion beam etching, an etching rate greatly depends on compatibility between a type of element of a crystal substrate to be etched and a size of sputtering ions. When a mixing ratio of the fluorine gas to the Ar gas is out of the range of the invention, the etching rate becomes too small to be practical. In contrast, when the ratio of the gas mixture is within the range, it is possible to obtain a sufficient etching rate and control surface roughness within a practical level.

After etching for a sufficiently short period of time in the practical sense, it is possible to obtain the optical crystal having a desired thickness and accurate tolerance.

According to the present invention, in the method of manufacturing an optical crystal element for a laser, it is possible to manufacture an optical crystal having a thickness of 1 mm or less and suitable for an optical crystal element as a laser medium, resonator, and etalon in a microchip laser within a sufficiently short period of time. Therefore, it is possible to manufacture the optical crystal element for a microchip laser with low cost. It is also possible to control a thickness of the optical element with high precision, thereby improving laser property.

BRIEF DESCRIPTION OF THE DRAWINGS

FIGS. 3(a) and 3(b) are graphs showing spectra of laser light, wherein FIG. 3(a) is a spectrum when an optical crystal before etching is used as a laser medium, and FIG. 3(b) is a spectrum when the optical crystal is etched with the method according to the embodiment of the present invention;

DETAILED DESCRIPTION OF PREFERRED EMBODIMENTS

Figure 1:
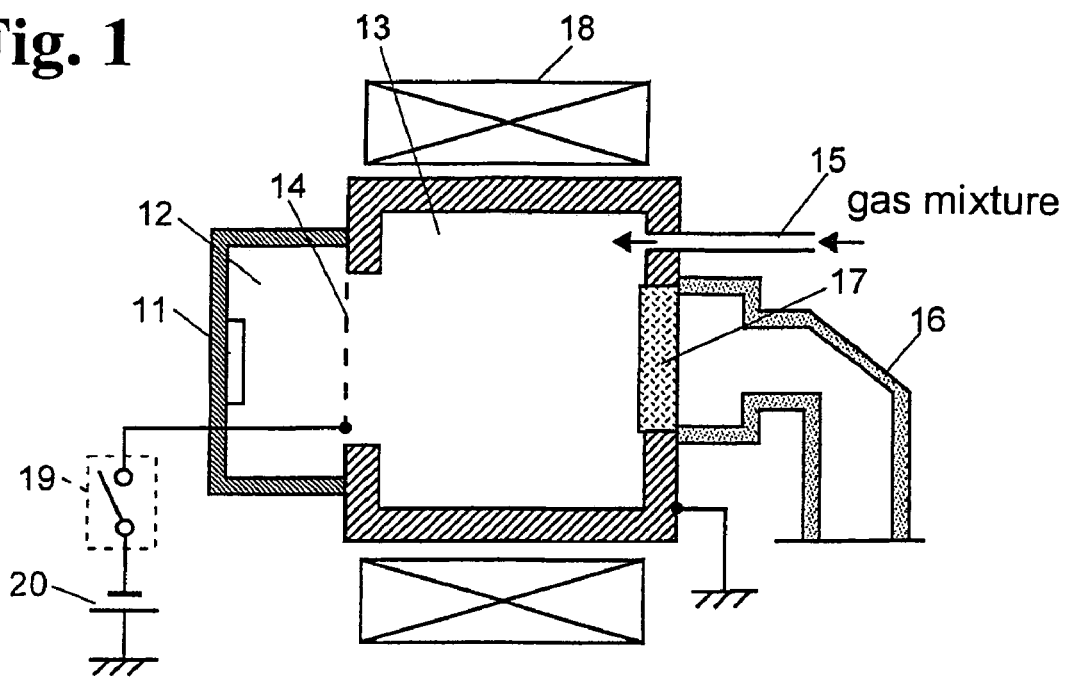
FIG. 1 is a sectional view of an ion beam irradiation apparatus used in a manufacturing method according to an embodiment of the present invention.

Hereunder, embodiments of the present invention will be explained with reference to the accompanying drawings. As an embodiment of the present invention, a method of manufacturing an optical crystal element formed of YAG for a microchip laser will be explained.

(i) Preparation of a Crystal Substrate and Measurement of Initial and Target Thicknesses A surface of a YAG crystal was polished first to prepare a disk-shaped crystal substrate with a thickness $d1=0.5$ mm and a diameter of 20 mm. An initial thickness of the crystal substrate was measured. Various methods may be used to measure the initial thickness of the YAG crystal, and the thickness was measured with a tolerance of 10 nm using a spectroscope as described below.

In general, a crystal thickness d is given by the following formula:

$$m \cdot \lambda = 2 \cdot n \cdot d \cdot \cos\theta \qquad (1)$$

where $\lambda$ is a transmission wavelength of the crystal, m is an order of interference, n is a refractive index, and $\theta$ is an incident angle of laser. The crystal thickness $d_1$ is obtained by measuring the wavelength $\lambda_1$ of the laser passing through the crystal and substituting known values of n, $\theta$ and m in the formula (1). With a sufficiently small $\theta$ and appropriate accuracy of $\lambda_1$ and n, the crystal thickness $d_1$ can be obtained within a tolerance of 10 nm. For example, when a thickness of the YAG crystal containing a rare earth element such as neodymium (Nd) is in an order of 100 μm, it is necessary to assure five-digit measurement accuracy to obtain a tolerance of 10 nm. Accordingly, it is necessary to assure five-digit accuracy to measure $\lambda$ and n for calculating $d_1$.

In the embodiment, a multi-mode laser with a fundamental wavelength $\lambda=946.484$ nm was output from the laser resonator, and irradiated on the YAG crystal. A spectrum near the second harmonic wave (473 nm, Blue line) was measured with a spectral analyzer. As a result, an order of interference $m=1998$ and a wavelength at the multimode oscillation $\lambda=946.484$ nm were obtained. In this embodiment, $n=1.8208$ (refractive index of Nd:YAG crystal) and $\theta=0.11$ were known. Applying these numbers to the formula (1) resulted in the initial thickness of $d_1=519.410$ μm. A similar measurement was conducted with regard to a single longitudinal mode laser wavelength (the central wavelength at the multimode oscillation). As a result, an oscillation wavelength $\lambda_2=946.200$ nm was obtained. Accordingly, the target thickness of $d_0=519.254$ μm was obtained.

(ii) Determination of Etching Amount and Time

From the above calculation, an etching amount δd of the YAG crystal through the etching was given as $\delta d = d_1 - d_0 = 156$ nm. In this embodiment, the following etching conditions were used.

Etching gas; $CHF_3$ and Ar gas mixture
Gas flow rate; Ar: 8 sccm, CHF3:3 sccm
Current density; 0.6 mA/cm$^2$
Degree of vacuum; $3.0 \times 10^{-2}$ Pa A mixing ratio of the $CHF_3$ gas to the Ar gas was 3:8 (ca. 1:2.67) The etching rate of the YAG crystal in the etching gas mixture was measured to be r=298.8 nm/hour. Accordingly, the required etching time was t=δd/r=156/298.8=0.522 hours=31 min.

(iii) Etching

FIG. 1 is a schematic view showing an ECR type ion light irradiation apparatus used in this embodiment. The YAG crystal substrate 11 was placed in a sample chamber 12. At this point, a special jig was used to ensure tight contact between the crystal substrate 11 and a sample table to obtain sufficient cooling effect during the etching. The etching gas, i.e., the gas mixture of $CHF_3$ and Ar, was introduced from a gas inlet 15. A microwave with a frequency of 2.45 GHz was introduced into an ion gun chamber 13 from a waveguide 16 through a microwave introduction window 17. A magnetic field of 875 mT was applied to the ion gun chamber 13 from an electromagnet 18. As a result, the gas mixture was ionized to achieve a plasma state.

When the ion gas chamber 13 was filled with the plasma, a switch 19 was turned on to apply a voltage dc from a power supply 20 to an electrode plate 14. The plasma within the ion gun chamber 13 moved toward the electrode plate 14 and contacted the YAG crystal substrate 11 to start the etching. A control circuit (not shown) starts measuring a period of time substantially at the same time when the etching starts. When the etching time t calculated in advance passed, the switch 19 was turned off to stop the etching. In the ion light irradiation apparatus, when the dc current was stopped, the etching is stopped immediately. Accordingly, the etching was performed precisely for the set period of time.

As described above, with the manufacturing method in the embodiment, it is possible to precisely etch a desired amount of the YAG crystal substrate, thereby making it easy to obtain the optical crystal element with a target thickness in a short period of time. After the etching described above, surface roughness of the YAG crystal was 0.36 nm in the un-etched section and 0.51 nm in the etched section. Accordingly, it is confirmed that the surface roughness was sufficiently small even after the etching.

FIGS. 3(a) and 3(b) are graphs showing spectra of the laser light, wherein FIG. 3(a) is a spectrum when the optical crystal was used as a laser medium before the etching, and FIG. 3(b) is a spectrum when the optical crystal was etched with the method according to the embodiment. As shown in FIGS. 3(a) and 3(b), the thickness of the crystal was precisely controlled with the etching, so that it is possible to obtain a single longitudinal mode laser extremely coherent in terms of space and wavelength regions.

A similar etching experiment was performed on a crystal substrate formed of $YVO_4$. The etching conditions were same as those in the YAG substrate except that the etching rate for the $YVO_4$ substrate was 259.2 nm/hour slightly lower than that in the YAG substrate. The etching rate was still sufficiently high, and it was confirmed that the surface roughness was same or better than that of the YAG substrate.

Figure 2:
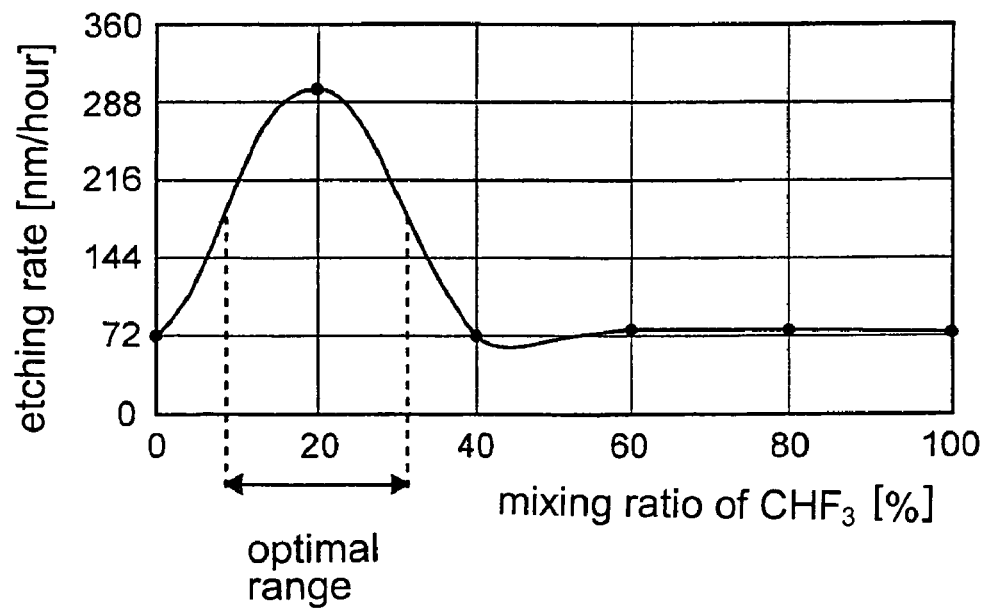
FIG. 2 is a graph showing a relationship between a ratio of a $CHF_3$ gas in a gas mixture used as an etching gas and an etching rate.
Figure 4:
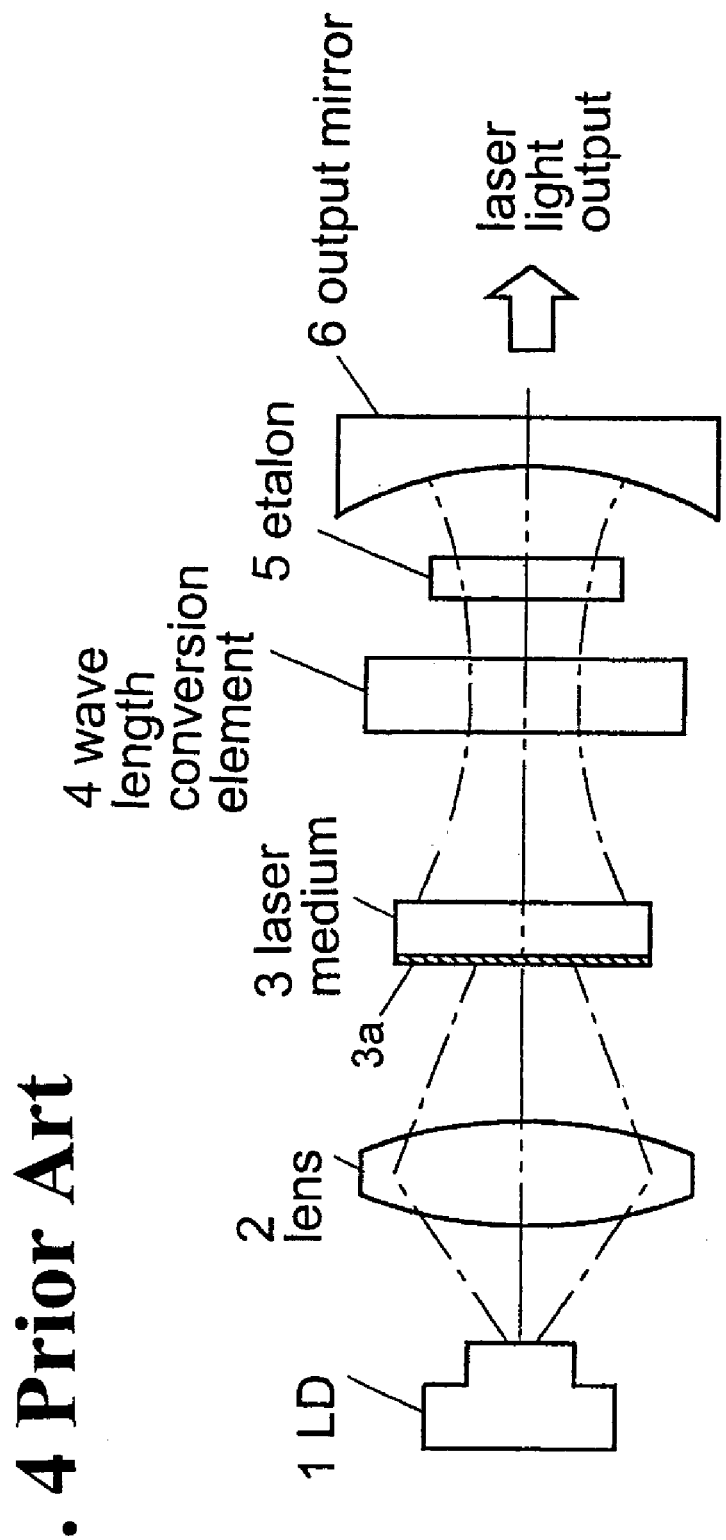
FIG. 4 is a schematic view showing a general high-order harmonic wave type LD excitation solid-state laser device.
Figure 5:
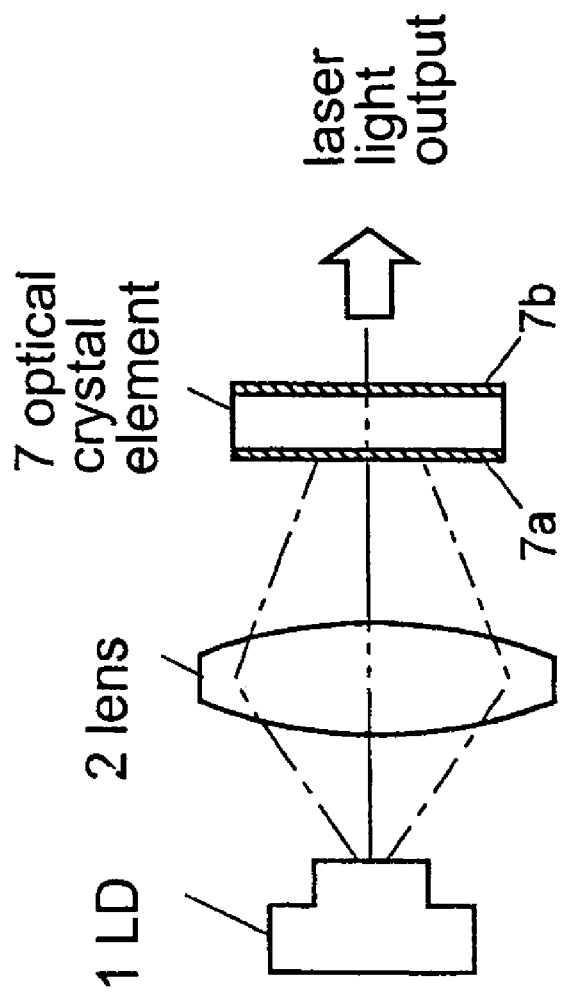
FIG. 5 is a schematic view showing a microchip laser device in which the optical crystal element manufactured with the method of the present invention is used.

In the embodiments described above, the mixing ratio of $CHF_3$ to Ar was 3:8. To obtain a range of the mixing ratio for a good etching rate, measurements were conducted while varying the mixing ratio. As shown in FIG. 2, when only the Ar gas was used or the proportion of the $CHF_3$ gas in the gas mixture was 40% or greater (mixing ratio of 2:3), the etching rate was found to be small, i.e., 72 nm/hour. In contrast, when the proportion of the $CHF_3$ gas in the gas mixture was within a range of 8% to 33%, a high etching rate about 2.5 to 3 times or greater was achieved. Accordingly, when the mixing ratio of the $CHF_3$ gas to the Ar gas is within the range of about 1:10 to 1:2, it is possible to obtain a sufficient etching rate.

The disclosure of Japanese Patent Application No. 2004-030299, filed on Feb. 6, 2004, is incorporated in the application.

While the invention has been explained with reference to the specific embodiments of the invention, the explanation is illustrative and the invention is limited only by the appended claims.

What is claimed is:

1. A method of manufacturing an optical crystal element of a laser device, comprising:
    measuring an initial thickness of a crystal substrate formed of YAG or $YVO_4$,
    placing the crystal substrate in a process chamber,
    introducing a gas mixture of a fluorine gas and an Ar gas into the process chamber, said gas mixture having a ratio of the fluorine gas to the Ar gas in a range of 1:10 to 1:2, and
    generating ion beams of the gas mixture for etching a surface of the crystal substrate for a predetermined period of time.

2. A method according to claim 1, wherein said predetermined period of time is determined from an etching rate according to the mixing ratio of the gas mixture and the initial thickness of the crystal substrate.

3. A method according to claim 1, wherein said fluorine gas is $CHF_3$.

4. A method according to claim 1, further comprising, prior to measuring the initial thickness, forming said crystal substrate by mechanical polishing.

5. A method according to claim 1, wherein said optical crystal element is used for a laser medium, a resonator and an etalon in a microchip laser.

* * * * *